United States Patent
Roellgen et al.

(10) Patent No.: US 8,294,452 B2
(45) Date of Patent: Oct. 23, 2012

(54) ARRANGEMENT AND METHOD FOR MEASURING A CURRENT FLOWING IN AN ELECTRICAL CONDUCTOR

(75) Inventors: Bernhard Roellgen, Munich (DE); Martin Neudecker, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/699,333

(22) Filed: Feb. 3, 2010

(65) Prior Publication Data

US 2010/0188072 A1 Jul. 29, 2010

Related U.S. Application Data

(63) Continuation of application No. PCT/EP2008/060233, filed on Aug. 4, 2008.

(30) Foreign Application Priority Data

Aug. 3, 2007 (DE) .......................... 10 2007 036 573

(51) Int. Cl.
G01R 15/20 (2006.01)
(52) U.S. Cl. ................................................. 324/117 H
(58) Field of Classification Search .................. None
See application file for complete search history.

(56) References Cited

U.S. PATENT DOCUMENTS

| | | | | |
|---|---|---|---|---|
| 3,323,056 A | * | 5/1967 | Haley | 324/117 R |
| 3,935,506 A | * | 1/1976 | Brockmann | 315/368.26 |
| 3,940,688 A | * | 2/1976 | Lazzari et al. | 324/243 |
| 4,059,798 A | * | 11/1977 | Dierker et al. | 324/117 H |
| 4,947,108 A | * | 8/1990 | Gudel | 324/117 H |
| 5,617,019 A | * | 4/1997 | Etter | 324/117 R |
| 6,411,078 B1 | * | 6/2002 | Nakagawa et al. | 324/117 H |
| 7,332,903 B2 | | 2/2008 | Hausperger et al. | |
| 7,541,799 B2 | | 6/2009 | Hausperger et al. | |
| 7,579,825 B2 | * | 8/2009 | Hausperger et al. | 324/117 H |
| 7,622,909 B2 | | 11/2009 | Teppan | |
| 7,911,197 B2 | * | 3/2011 | Roellgen | 324/117 H |
| 7,911,198 B2 | * | 3/2011 | Roellgen et al. | 324/117 H |
| 7,923,986 B2 | * | 4/2011 | Hausperger et al. | 324/117 H |
| 2006/0226826 A1 | | 10/2006 | Teppan | |
| 2006/0290341 A1 | | 12/2006 | Hausperger et al. | |
| 2007/0052407 A1 | | 3/2007 | Hausperger et al. | |
| 2008/0048655 A1 | * | 2/2008 | Hausperger et al. | 324/260 |
| 2009/0295384 A1 | | 12/2009 | Teppan | |
| 2010/0134093 A1 | * | 6/2010 | Roellgen | 324/117 H |
| 2010/0181991 A1 | * | 7/2010 | Roellgen et al. | 324/117 H |

FOREIGN PATENT DOCUMENTS

| | | | |
|---|---|---|---|
| DE | 102006016745 | * | 10/2006 |
| DE | 10 2005 040 316 A1 | | 3/2007 |
| DE | 10 2005 024 075 B4 | | 4/2007 |
| DE | 10 2007 025 505 A1 | | 12/2008 |
| EP | 1 450 176 A1 | | 8/2004 |
| EP | 1 762 852 A2 | | 3/2007 |

* cited by examiner

*Primary Examiner* — Jermele M Hollington
(74) *Attorney, Agent, or Firm* — Slater & Matsil, L.L.P.

(57) ABSTRACT

An arrangement for measuring a current flowing in an electrical conductor includes a magnetic circuit, for coupling to the electrical conductor, the magnetic circuit has an air gap. A magnetic field-sensitive component that serves for measuring the magnetic field generated by the electrical conductor is situated between the arms of the magnetic circuit. Two control cores are arranged in the air gap of the magnetic circuit. The control cores each include a control winding for magnetically saturating the respective control core and are arranged on both sides of the electrical conductor.

17 Claims, 2 Drawing Sheets

ARRANGEMENT AND METHOD FOR MEASURING A CURRENT FLOWING IN AN ELECTRICAL CONDUCTOR

This application is a continuation of co-pending International Application No. PCT/EP2008/060233, filed Aug. 4, 2008, which designated the United States and was not published in English, and which claims priority to German Application No. 10 2007 036 573.1 filed Aug. 3, 2007, both of which applications are incorporated herein by reference.

BACKGROUND

German patent publication 10 2005 024 075 B4 discloses a device for measuring a current flowing in an electrical conductor.

SUMMARY

In one aspect, an arrangement and a method for measuring a current flowing in an electrical conductor enables a correct measurement independent of external magnetic influences.

The arrangement includes a magnetic circuit provided with an air gap and serving for coupling to an electrical conductor. A magnetic field-sensitive component for measuring the magnetic field generated by the electrical conductor is situated in the magnetic circuit. The magnetic field-sensitive component is preferably incorporated directly into the magnetic circuit. Two control cores are situated in the air gap of the magnetic circuit, wherein the control cores each include a control winding for magnetically saturating the respective control core and are arranged on both sides of the electrical conductor.

In one preferred embodiment, the magnetic circuit includes a U-shaped soft-magnetic core, into which the magnetic field-sensitive component is directly incorporated. The magnetic field-sensitive component is preferably situated centrally between the two arms of the U-shaped core.

The two control cores can be saturated by means of control currents independent of one another by windings applied to the control cores.

In one preferred embodiment, a first control core is situated on a first side of the electrical conductor and a second control core is situated on a second side of the electrical conductor.

The second control core is preferably situated parallel to the magnetic field-sensitive component between the two arms of the preferably U-shaped magnetic circuit.

In one embodiment, the magnetic circuit has an additional winding.

In one preferred embodiment, the two control cores lie in a common plane. The two control cores are preferably arranged between the two arms of the U-shaped core, on both sides of the electrical conductor.

Preferably, the magnetic circuit extends around the electrical conductor.

In one preferred embodiment, the control cores are embodied as ferrite cores. In this case, the ferrite cores are particularly preferably embodied as a rectangular frame having a control winding for saturating the ferrite core on at least one side of the frame. In a particularly efficient embodiment, control windings are arranged on two opposite sides of the frame. By embodying the control cores in this form, it is possible to achieve efficient saturation of the control cores.

By virtue of the fact that in the magnetic circuit the two control cores are not arranged one behind the other, but rather parallel to one another, that is to say on both sides of the electrical conductor, they can have, in comparison with a construction including two control cores arranged one above the other, more than double the number of turns of the control cores. Consequently, given the same wire diameter of the control windings, double the number of turns are available. This makes it possible to measure very large currents without the control cores being driven from saturation by the primary current. In the case of very large currents in the range of approximately 1000 A, the primary current would counteract the control current in one of the limbs of the control cores and thus drive the latter from saturation.

The magnetic field-sensitive component is preferably a Hall sensor.

If a Hall sensor has a current flowing through it and is introduced into a magnetic field running perpendicularly thereto, it supplies an output voltage proportional to the product of magnetic field strength and current.

In order to determine the current flowing in the electrical conductor, various measurements are carried out with the aid of the Hall sensor.

The method for measuring a current flowing in an electrical conductor is carried out using an arrangement as described above.

In the method, the flux density permeating the magnetic field-sensitive component is measured firstly in the case of unsaturated control cores.

In a second measurement, the first control core is saturated and the second control core remains unsaturated, wherein the flux density permeating the magnetic field-sensitive component is measured.

For a third measurement, the second control core is saturated and the first control core is unsaturated. The flux density permeating the magnetic field-sensitive component produces a third measured value.

For a fourth and last measurement, the flux density permeating the magnetic field-sensitive component is measured in the case of saturation of both control cores.

The current flowing through the electrical conductor is calculated from the four measured values determined by the measurements carried out previously.

For currents of less than 50 A, the first and third measurements have approximately the same current sensitivity. The second control core is unsaturated in the first measurement and saturated in the third measurement. Consequently, the same H-field is present at the magnetic field-sensitive component in both measurements. The H-field thus acts on the magnetic field-sensitive component analogously to an applied voltage. The magnetic reluctances of the magnetic circuit and of the control cores act analogously to electrical resistances.

Consequently, the following three equations hold true:

$$r_4 = n + s_4 * I_{DC} + S_{B4} * B_S \qquad \text{I.}$$

$$r_3 = n + s_3 * I_{DC} + S_{B3} * B_S \qquad \text{II.}$$

$$r_2 = n + s_2 * I_{DC} + S_{B2} * B_S \qquad \text{III.}$$

In the measurement, physical quantities are often converted into analog electrical quantities. During quantization, the measurement range of the analog quantity is divided into a finite number of mutually adjacent subranges (intervals) and each of these is assigned a value of a finite symbolic system (e.g., an integer). The term resolution denotes the number of employed subranges of the analog quantity, in the case of binary symbolic systems also their power of two (resolution in bits), but in the case of equally sized intervals also the size of the intervals themselves.

The quantization steps represent the value for the measurement signal in discrete form.

In the equations presented above $r_2$ indicates the number of quantization steps during a measurement, in the case of saturation of the first control core. $r_3$ represents the number in the case of saturation of the second control core. $r_4$ indicates the number of quantization steps in which both control cores are saturated. The variables $s_2$, $s_3$ and $s_4$ indicate the respective sensitivity of the Hall sensor with respect to the current flowing through the electrical conductor.

The variable n indicates the zero point of the magnetic field-sensitive component in quantization steps, in the case of which 0 A current is present in the electrical conductor and 0 tesla flux density is present at the magnetic field-sensitive component. The variables $S_{B2}$, $S_{B3}$ and $S_{B4}$ indicate the sensitivity of the magnetic field-sensitive component in the case of saturation of the first control core, in the case of saturation of the second control core and, respectively, in the case of saturation of both control cores. The variable $B_S$ designates the magnetic flux density of a disturbing external magnetic field. The variable $I_{DC}$ indicates the current flowing through the electrical conductor, which current is intended to be determined in the measurement.

All the sensitivities are determined during the production of the arrangement and permanently stored in the evaluation unit.

Subsequent elimination of n yields:

$$r_4 - r_3 = (s_4 - s_3) * I_{DC} + (S_{B4} - S_{B3}) * B_S \qquad \text{I-II.}$$

$$r_4 - r_2 = (s_4 - s_2) * I_{DC} + (S_{B4} - S_{B2}) * B_S \qquad \text{I-III.}$$

The two equations I-II and I-III are solved with respect to $I_{DC}$, subsequently equated and further solved with respect to $B_S$:

$$B_s = r_3 * (s_2 - s_4) + r_4 * (s_3 - s_2) + r_2 * (s_4 - s_3) / (s_{B4} * (s_3 - s_2) + s_{B3} * (s_2 - s_4) + s_{B2} * (s_4 - s_3))$$

In order to determine $I_{DC}$ and n, a solution process can be carried out by inserting $B_s$ into the equations I-II or I-III and then by inserting $I_{DC}$ and $B_s$ into one of the equations I to III. n can be determined by solution with respect to equation III, and $I_{DC}$ can be determined by solution with respect to equation II. Equation I is the best suited to determining $B_s$.

As an alternative, $B_s$ can also be disregarded in equation II or III. The slightly inaccurately determined primary current $I_{DC}$ can be used, if necessary, for determining $B_s$.

It is known that Hall sensors can drift for a number of reasons, some of which are described in greater detail below.

The Hall cell is embodied, in the case of monolithic construction, preferably as a weakly doped diffusion region in the silicon substrate or an epitaxial layer. A conductive plate is preferably applied thereabove in order that the shot noise is reduced. The weakly doped diffusion region forms a parasitic diode which has to be biased in the reverse direction. The so-called "back bias effect" occurs, a drift movement of the space charge zones (analogously to variable-capacitance diodes). The thickness modulation of the space charge zone directly affects the sensitivity of the Hall cell (approximately +3 to 5%/V). The conductive plate above the Hall cell usually likewise has a bias voltage applied to it. This bias voltage likewise brings about a thickness modulation of the space charge zone of the weakly doped diffusion region (0.01%/V). If the bias voltages drift, e.g., as a result of ageing, then the sensitivity of the Hall cell also drifts.

Furthermore, Hall elements have a great sensitivity for the piezoresistive effect. Mechanical deformations as a result of external pressure or as a result of water absorption alter the sensitivity of the Hall cell. If the silicon chip is coated with a soft plastic before the housing is injection-molded, then the long-term drift of the sensitivity can be reduced to 0.25%. Mechanical deformations occur after just a small number of operating hours (10 to 100 h), are reversible in some cases and usually have the largest share of the long-term drift.

Interstitial diffusion of impurities, e.g., of weakly bonded hydrogen, is known for the resistance drift of diffused resistances in semiconductors. The long-term drift can amount to 1%/100 000 hours.

n+ doped diffusion regions of 130 nm BICMOS processes have a temperature coefficient of approximately 1500 to 2000 ppm/K. Modern Hall sensors compensate for the temperature drift by measuring the junction temperature and by calculating a temperature-compensated measured value.

The Hall sensor used in the arrangement exhibits ageing of the sensitivity. The sensitivities of the Hall sensor ($S_{B2}$, $S_{B3}$ and $S_{B4}$) that are used in the equations are exclusively dependent on the mechanical construction. If the mechanical system cannot vary, for example, as a result of full encapsulation, the sensitivities can only vary if the magnetic field sensor itself becomes more sensitive or less sensitive over time. The possibility is thereby afforded of determining the ageing of the sensitivity of the magnetic field sensor by carrying out a solution process by solving the equation system composed of a total of four equations with respect to the sensitivity of the Hall sensor. In order to enable a more accurate measurement, the sensitivity of the Hall sensor can be represented as a common factor of all the sensitivities and the sensitivity of the Hall sensor $s_{hall}$ can be calculated by means of the following equation.

$$r_x = n + s_{hall}(I * s_x + B * s_{Bx})$$

In the equation indicated above, $r_x$ indicates the number of quantization steps for the respective state x. The variable x stands for one of the four cases (x=1, 2, 3, 4). In the first case, both control cores are unsaturated; in the second case, only the first control core is saturated; in the third case, only the second control core is saturated; and in the fourth case, both control cores are saturated. The variable n indicates the zero point of the magnetic field-sensitive component in quantization steps, in the case of which 0 A current is present in the electrical conductor and 0 tesla flux density is present at the magnetic field-sensitive component. The variable $S_{Bx}$ indicates the sensitivity of the magnetic field-sensitive component for the corresponding state. The variable B designates the magnetic flux density of a disturbing external magnetic field.

Consequently, the sensitivity $S_{hall}$ of the magnetic field-sensitive component can be calculated from the measured values previously obtained.

The arrangement is explained in greater detail below on the basis of exemplary embodiments and the associated figures.

The drawings described below should not be regarded as true to scale. Rather, for improved illustration, individual dimensions may be illustrated as enlarged, reduced or distorted.

BRIEF DESCRIPTION OF THE DRAWINGS

Elements which resemble each other or which perform the same function are designated by identical reference symbols.

The following list of reference symbols may be used in conjunction with the drawings:

| 1 | electrical conductor |
|---|---|
| 2 | magnetic circuit |
| 3 | air gap |
| 4 | magnetic field-sensitive component |
| 5a | first control core |
| 5b | second control core |
| 6 | control winding |

DETAILED DESCRIPTION OF ILLUSTRATIVE EMBODIMENTS

Figure 1:
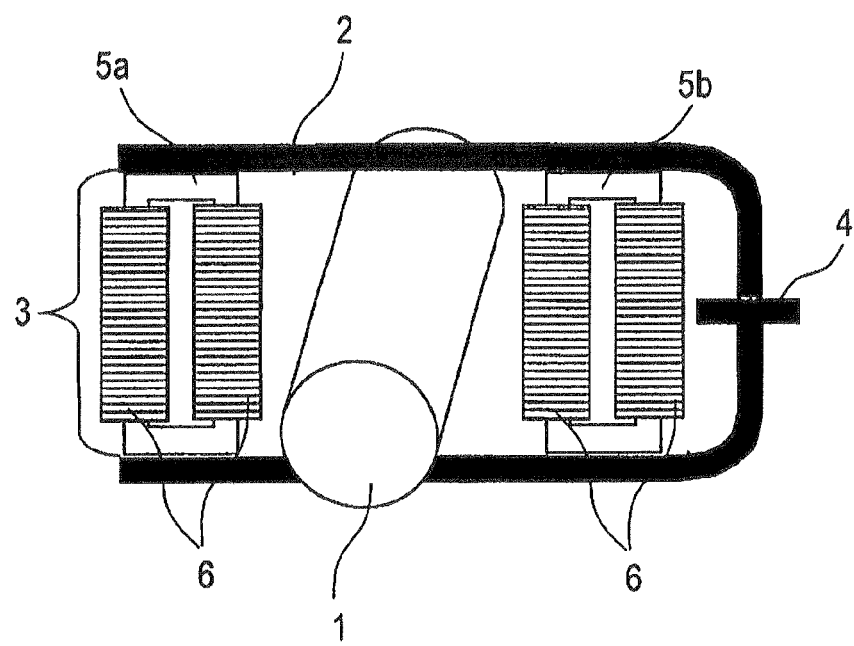
FIG. 1 shows an exemplary arrangement for measuring a current flowing in an electrical conductor.

FIG. 1 shows one possible embodiment of the example arrangement for measuring a current flowing in an electrical conductor 1, wherein a magnetic circuit 2, which can include ferrite, extends around an electrical conductor 1. The magnetic circuit 2 has on one side an air gap 3, in which two control cores 5a, 5b are situated. The control cores 5a, 5b are preferably arranged on both sides of the electrical conductor 1. In this case, the second control core 5b is arranged in the vicinity of the magnetic field-sensitive component 4, preferably parallel to the latter. In the U-shaped magnetic circuit 2, a magnetic field-sensitive component 4 for measuring the current flowing in the electrical conductor 1 is situated preferably between the arms of the magnetic circuit 2. The control cores 5a, 5b each have control windings 6 serving for saturating the control cores 5a, 5b. The control windings 6 are preferably situated on one or a plurality of, preferably opposite, sides of the frame of the control core 5a, 5b.

Figure 2:
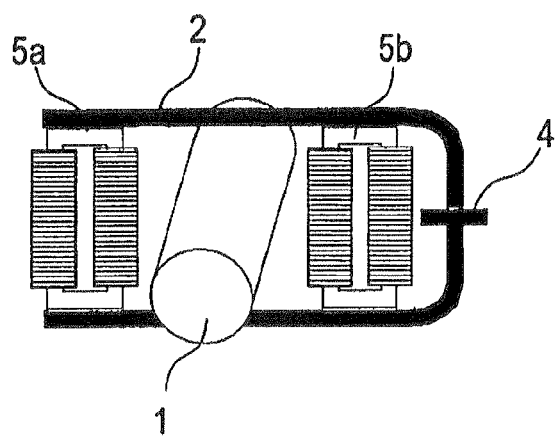
FIG. 2 shows the first construction for measuring a current flowing in an electrical conductor in the case of unsaturated control cores.

FIG. 2 shows the first measurement construction for measuring the current flowing through the electrical conductor 1. The control cores 5a, 5b are preferably arranged on both sides of the electrical conductor 1. In the first measurement, both control cores 5a, 5b are unsaturated. The magnetic field-sensitive component 4 arranged between the arms of the U-shaped magnetic circuit 2 measures the current flowing through the electrical conductor 1.

The H-field brought about by the current flow through the electrical conductor 1 generates a B-field in the two arms of the U-shaped magnetic circuit 2 and in the control cores 5a, 5b. If the magnetic reluctance of the first control core 5a is not significantly less than the magnetic reluctance of the magnetic circuit 2 and of the second control core 5b, then the magnetic field-sensitive component 4 is permeated by almost just as much B-field as if the second control core 5b were not present or were saturated. The current sensitivity of the construction is very high as a result. The entire magnetic circuit 2 is closed by the control cores 5a, 5b, whereby the sensitivity to disturbing external magnetic fields is low. For accurately measuring small currents in the case of a known zero point and in the case of a known disturbing external magnetic field, no control cores 5a, 5b needs to be energized. The magnetic field-sensitive component 4 is still able in this case to measure the B-field.

Figure 3:
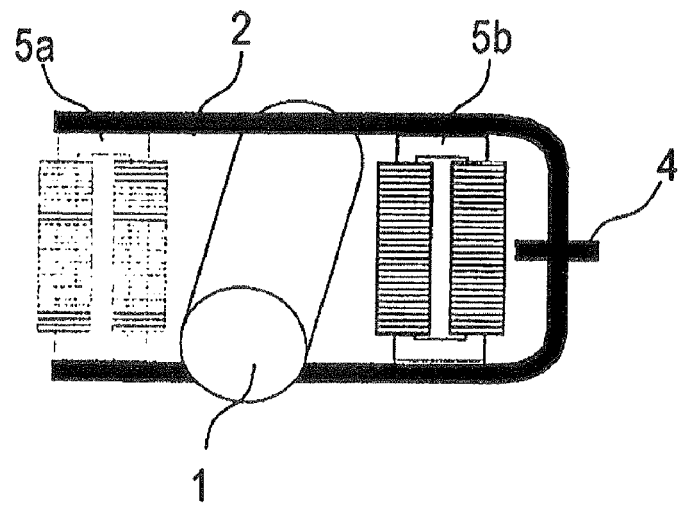
FIG. 3 shows the second construction for measuring a current flowing in an electrical conductor in the case of saturation of the first control core.

FIG. 3 shows the second construction for measuring the current flowing through the electrical conductor 1. For the second measurement of the current flowing through the magnetic field-sensitive component 4, the first control core 5a is saturated. The second control core 5b remains unsaturated.

The magnetic reluctance of the first control core 5a increases to such a great extent that virtually no magnetic flux (B-field) can be registered in the magnetic field-sensitive component 4 since, in this case, the magnetic reluctance of the second control core 5b is significantly less than the magnetic reluctance that is effective in the magnetic circuit 2. The sensitivity to disturbing external magnetic fields is low because the predominant portion of the field lines flowing through the construction flows through the second control core 5b, having good magnetic permeability.

Figure 4:
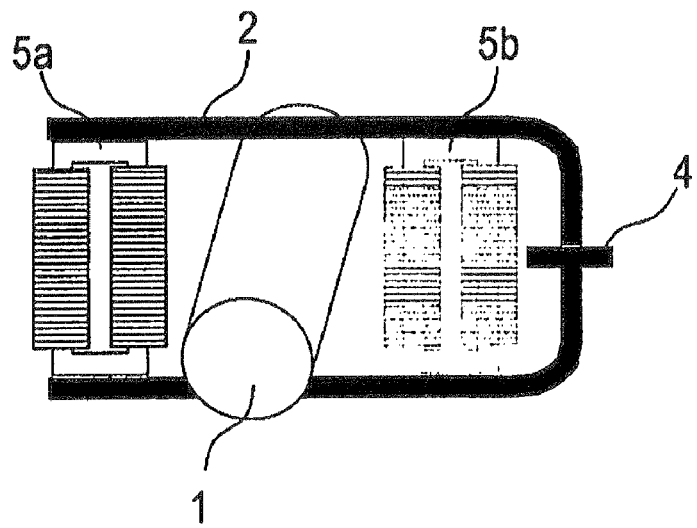
FIG. 4 shows the third construction for measuring a current flowing in an electrical conductor in the case of saturation of the second control core.

FIG. 4 shows a third construction wherein the current flowing through the electrical conductor 1 is measured by means of the magnetic field-sensitive component 4. For the third measurement, the second control core 5b is saturated. The first control core 5a is unsaturated.

In this construction, the magnetic reluctance of the first control core 5a is low, but the magnetic reluctance of the second control core 5b is high, such that the construction is magnetically closed again. Slightly more field lines flow through the magnetic field-sensitive component 4 than in the case of the first measurement illustrated in FIG. 2.

Figure 5:
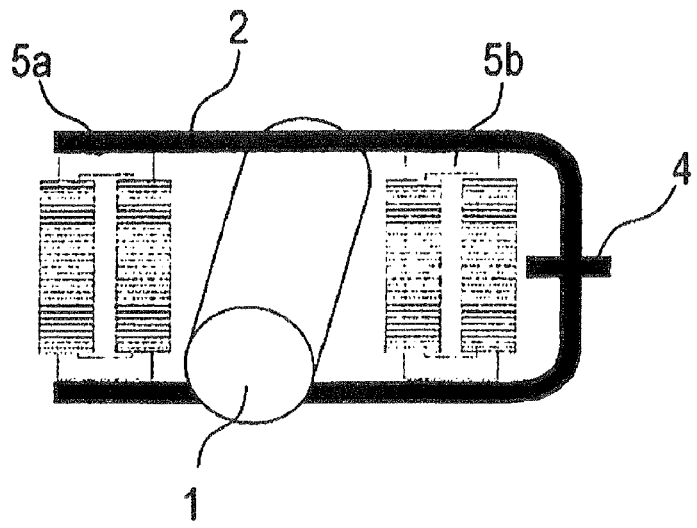
FIG. 5 shows the fourth construction for measuring a current flowing in an electrical conductor in the case of saturation of both control cores.

FIG. 5 shows the fourth construction for measuring the current flowing through the electrical conductor 1. For the fourth measurement, both control cores 5a, 5b are saturated. In this construction, the magnetic circuit is open. Almost all the field lines pass through the air gap 3 in the U-shaped magnetic circuit 2, in which the magnetic field-sensitive component 4 is situated. External disturbance fields and also the magnetic field generated by the current flowing through the electrical conductor 1 are detected by the magnetic field-sensitive component 4 with high sensitivity. The sensitivity for the current flowing through the electrical conductor 1 is approximately one power of ten lower than in the measurements illustrated in FIGS. 2 and 4, and it is approximately one power of ten greater than in the case of the measurement illustrated in FIG. 3. However, the sensitivity to disturbing external magnetic fields can be greater than in the other three measurements by more than one power of ten.

Although only a restricted number of possible developments of the invention were able to be described in the exemplary embodiments, the invention is not restricted thereto. It is possible, in principle, to use a different number of control windings or a different form of magnetic circuit for the arrangement. The invention is not restricted to the number of elements illustrated schematically.

The description of the subject matters and methods specified here is not restricted to the individual specific embodiments. Rather, the features of the individual embodiments, insofar as is technically expedient, can be combined with one another as desired.

What is claimed is:

1. An arrangement for measuring a current flowing in an electrical conductor, the arrangement comprising:

a magnetic circuit having an air gap for coupling to the electrical conductor;

a magnetic field-sensitive component arranged in the magnetic circuit and configured to measure a magnetic field generated by the electrical conductor; and first and second control cores arranged in parallel in the air gap, so that the electrical conductor can be situated between the control cores, wherein the control cores each comprise a control winding for magnetically saturating the respective control core, wherein the second control core is arranged parallel to the magnetic field-sensitive component;

wherein the first and second control cores are independently controllable and are arranged so that the arrangement is configured to:

measure flux density permeating the magnetic field-sensitive component when the control cores are unsaturated; and measure flux density permeating the magnetic field-sensitive component when the first core is saturated and the second core is unsaturated; and measure flux density permeating the magnetic field-sensitive component when the second control core is saturated and the first control core is unsaturated; and measure flux density permeating the magnetic fields sensitive component when both the first and second control cores are saturated.

2. The arrangement according to claim 1, wherein the first control core is arranged on a first side of the electrical conductor and the second control core is arranged on a second side of the electrical conductor.

3. The arrangement according to claim 1, wherein the magnetic circuit comprises an additional winding.

4. The arrangement according to claim 1, wherein the first and second control cores lie in a common plane.

5. The arrangement according to claim 1, wherein the magnetic circuit extends around the electrical conductor.

6. The arrangement according to claim 1, wherein the first and second control cores each comprise a ferrite core.

7. The arrangement according to claim 1, wherein the first and second control cores each comprise a rectangular frame and each comprise a control winding for saturating the control cores on at least one side of the frame.

8. The arrangement according to claim 1, wherein the first and second control cores each comprise a control winding on two opposite sides.

9. The arrangement according to claim 1, wherein the first and second control cores have saturation even in a case of very large currents.

10. The arrangement according to claim 1, wherein the magnetic field-sensitive component is a Hall sensor.

11. A method for measuring a current flowing in an electrical conductor, the method comprising:

locating the electrical conductor within an air gap of a magnetic circuit, first and second control cores being arranged in parallel in the air gap, wherein the control cores each comprise a control winding for magnetically saturating the respective control core;

measuring a flux density permeating a magnetic field-sensitive component arranged in the magnetic circuit in parallel with at least the first control core, the flux density being measured in a case of unsaturated control cores;

measuring the flux density permeating the magnetic field-sensitive component in a case of saturation of the first control core;

measuring the flux density permeating the magnetic field-sensitive component in a case of saturation of the second control core; and measuring the flux density permeating the magnetic field-sensitive component in the case of saturation of the first and second control cores.

12. The method according to claim 11, further comprising calculating the current flowing through the electrical conductor from the measured flux densities.

13. The method according to claim 12, further comprising calculating a sensitivity of the magnetic field-sensitive component from the measured flux densities.

14. The arrangement according to claim 1, further comprising the electrical conductor located between the control cores.

15. A circuit comprising:

a magnetic circuit having an air gap;

an electrical conductor located in the air gap;

a first control core arranged in the air gap, wherein the first control core comprises a first control winding for magnetically saturating the first control core;

a second control core arranged in the air gap in parallel with the first control core, wherein the second control core comprises a second control winding for magnetically saturating the second control core; and a magnetic field-sensitive component arranged in the magnetic circuit and configured to measure a magnetic field generated by the electrical conductor that is arranged in the air gap and surrounded by the magnetic circuit on a top side and on a bottom side of the electrical conductor, by the first control core on a left side of the electrical conductor and by the second control core on a right side of the electrical conductor, the top side opposite the bottom side and the left side opposite the right side;

wherein the first and second control cores are independently controllable and are arranged so that the arrangement is configured to:

measure flux density permeating the magnetic field-sensitive component when the first and second control cores are unsaturated; and measure flux density permeating the magnetic field-sensitive component when the first core is saturated and the second core is unsaturated; and measure flux density permeating the magnetic field-sensitive component when the second control core is saturated and the first control core is unsaturated; and measure flux density permeating the magnetic fields sensitive component when first and second control cores are saturated.

16. The circuit according to claim 15, wherein the magnetic field-sensitive component is arranged parallel to the first control core and to the second control core.

17. A magnetic apparatus comprising:

a U-shaped magnetic circuit that includes a first extending portion, a second extending portion parallel to the first extending portion and a base portion between a first end the first extending portion and a second end of the second extending portion, wherein an air gap is enclosed on three sides by the first and second extending portions and the base portion;

a magnetic field-sensitive component arranged in series with the magnetic circuit and configured to measure a magnetic field within the air gap;

a first control core arranged in the air gap adjacent second ends of the first and second extending portions, wherein the first control core comprises a first control winding for magnetically saturating the first control core; and a second control core arranged in the air gap adjacent the base portion and parallel to the magnetic field-sensitive component, the second control core in parallel with but spaced from the first control core, wherein the second control core comprises a second control winding for magnetically saturating the second control core.

* * * * *